United States Patent [19]

Noguchi

[11] Patent Number: 5,068,263

[45] Date of Patent: Nov. 26, 1991

[54] RESIN COMPOSITION CURABLE WITH AN ACTIVE ENERGY RAY CONTAINING GRAFT COPOLYMERIZED POLYMER WITH TRUNK CHAIN CONTAINING DICYCLOPENTENYL GROUP

[75] Inventor: Hiromichi Noguchi, Atsugi, Japan

[73] Assignee: Canon Kabushiki Kaisha, Tokyo, Japan

[21] Appl. No.: 244,301

[22] Filed: Sep. 15, 1988

[30] Foreign Application Priority Data

Sep. 16, 1987 [JP] Japan ................... 62-229492
Jun. 29, 1988 [JP] Japan ................... 62-159076

[51] Int. Cl.$^5$ ................. C08L 51/00; C08L 47/00; C08L 33/04; C08G 63/48
[52] U.S. Cl. ................. 522/109; 525/64; 525/66; 525/75; 525/77; 525/84; 525/85
[58] Field of Search ............... 522/31, 102, 109; 525/65, 80, 84, 85, 77, 75, 108, 190, 64, 66

[56] References Cited

U.S. PATENT DOCUMENTS

| | | | |
|---|---|---|---|
| 4,688,052 | 8/1987 | Inamoto et al. | 522/102 |
| 4,688,054 | 8/1987 | Inamoto et al. | 525/65 |
| 4,839,400 | 6/1989 | Sato et al. | 522/102 |

FOREIGN PATENT DOCUMENTS

| | | | |
|---|---|---|---|
| 0206086 | 12/1986 | European Pat. Off. | 522/102 |
| 3620254 | 12/1986 | Fed. Rep. of Germany | 522/102 |

*Primary Examiner*—Marion E. McCamish
*Assistant Examiner*—Susan Berman
*Attorney, Agent, or Firm*—Fitzpatrick, Cella, Harper & Scinto

[57] ABSTRACT

An improved active energy ray-curing resin composition comprising (i) a graft copolymerized polymer with a trunk chain containing dicyclopentenyl derivative group which has a number average molecular weight of 5,000 or more and a weight average molecular weight of 50,000 or less: (ii) a linear polymer having a number average molecular weight of 5,000 or more and a weight average molecular weight of 350,000 or less and having a glass transition temperature of 60° C. or more: (iii) a monomer having an ethylenically unsaturated bond: and (iv) a photopolymerization initiator capable of generating free radicals with irradiation of an active energy ray. The resin composition can be desirably cured with an active energy ray such as ultraviolet ray or electron beam and it is capable of being laminated in a desired pattern on a copper-coated laminate for use as a printed board or on a plate of metal, glass, ceramics or plastic.

4 Claims, No Drawings

RESIN COMPOSITION CURABLE WITH AN ACTIVE ENERGY RAY CONTAINING GRAFT COPOLYMERIZED POLYMER WITH TRUNK CHAIN CONTAINING DICYCLOPENTENYL GROUP

FIELD OF THE INVENTION

This invention relates to a resin composition curable with an active energy ray such as ultraviolet ray or electron beam. More particularly, it relates to an improved resin composition curable with said active energy ray which is capable of being laminated in a desired pattern on a copper-coated laminate for use as a printed board or on a plate of metal, glass, ceramics or plastic.

BACKGROUND OF THE INVENTION

In recent years, there have been often used various resin compositions curable with an active energy ray in coatings or inks, or as a sealing material, as a resist material, as a material for forming a protective film or as a material for forming a pattern. As such resin compositions, for use in forming a protective film for printed wiring board or for use as a resist material for forming a wiring pattern therefor, there are known, for example, a dry film resist containing a high molecular material capable of forming a film under the trade name of RISTON (produced by Du Pont Japan Ltd.) and a thick film liquid resist according to photographic method under the trade name of PROBIMER (produced by Ciba Geigy Co.).

These known resin compositions comprise mainly (a) high molecular materials contributing to formation of a film or a dry coating and (b) a material curable with an active energy ray. And for these resin compositions, their adhesiveness with a substrate, their developing properties for the formation of a pattern, their durability, painting property and drying property as a paint film are varied depending upon the kinds and the molecular structures of said high molecular materials (a). Therefore, when such resin composition is used aiming at providing the above properties as desired, the kinds of the high molecular materials (a) and the molecular design among the components are properly determined so as to meet the requirements.

However, any of the known resin compositions curable with an active energy is still not sufficient in view of the adhesiveness with various substrates even in the case where it is so designed in the above way.

In order to solve this problem, there have been made proposals to add an auxiliary capable of forming a complex with a metal such as a specific heterocyclic compound or a coupling agent to such resin composition, whereby improving its adhesiveness with a metallic substrate as disclosed in Japanese Laid-open Patent Applications No. 5934/1976 and No. 24035/1983.

However, there is still an unsolved problem in the case of any of these proposals, that the additive will cause oxidation or corrosion on the resin composition after the lapse of time.

Other than the above proposals, there has been proposed a high molecular material comprising a graft copolymerized polymer having polar groups on its graft chains aiming at obtaining a cured composition exhibiting a sufficient adhesiveness with a substrate without addition of such additive as mentioned above by Japanese Laid-open Patent Application No. 283645/1986.

The resin composition curable with an active energy ray containing said high molecular material to be provided by this publication is such that it makes it possible to realize an improvement in the adhesiveness of the resulting paint film with a substrate and also in its durability without using such additive as mentioned above. However, even for such resin composition as described in the above publication, there still remains the unsolved problem of how to determine the molecular structures for the high molecular weight materials to be used in preparing resins having the desired properties. In fact, in general, it is technically difficult to synthesize a desirable graft copolymerized polymer so that it has a predetermined molecular weight and a predetermined content for the graft chains and it has a desired weight average molecular weight in the range from 50,000 to 350,000.

In order to provide desired enhancement in the developing properties upon formation of a pattern, in other words, in the dissolving rate of unpolymerized part, the swelling of polymerized part, the sensitivity as a result of these factors, the sharpness of the resulting pattern and the controlling ability of the resolution, it is necessary for the number average molecular weight of the high molecular material involved to be not excessively small. In the case of a graft copolymerized polymer, to connect a plurality of graft chains having a length sufficient enough to provide an effective adhesiveness with its trunk chain of a relatively large molecular weight to thereby make the resulting graft copolymerized polymer to have a desired number average molecular weight is generally recognized as being difficult because of steric hindrance in this technical field.

In the case where the number average molecular weight of the high molecular material involved is excessively small, when a pattern is formed using such high molecular material, there are limits for the developing properties, that is, the dissolving rate of unpolymerized part, the swelling of polymerized part, the sensitivity as a result of these factors, the sharpness of the resulting pattern and the controlling allowance of the resolution.

SUMMARY OF THE INVENTION

This invention has been accomplished in view of the problems as described above and an object of this invention is to provide an improved resin composition curable with an active energy ray such as ultraviolet ray or electron beam which is capable of being laminated in a desired pattern on a copper-coated laminate for use as a printed board or on a plate of metal, glass, ceramics or plastic.

Another object of this invention is to provide an improved resin composition curable with an active energy ray which exhibits an excellent adhesiveness with a substrate without addition of any auxiliary.

A further object of this invention is to provide an improved resin composition curable with an active energy ray which exhibits excellent developing properties upon formation of a pattern.

A still further object of this invention is to provide an improved resin composition curable with an active energy ray which may be easily controlled so as to exhibit desired properties upon application purposes.

DETAILED DESCRIPTION OF THE INVENTION

The resin composition curable with an active energy ray to attain the above objects of this invention comprises; (i) a graft copolymerized polymer having a number average molecular weight of 5,000 or more and a weight average molecular weight of 50,000 or less, which comprises a trunk chain composed mainly of structural units derived from at least one monomer selected from the group consisting of a monomer containing, in the molecule, a (meth)acryloyl group and a dicyclopentenyl derivative group represented by the general formula (I):

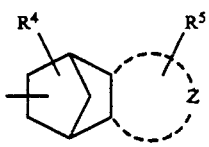

where Z represents a 5-membered ring shown by

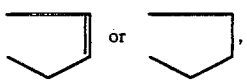

$R^4$ and $R^5$ each represents a hydrogen atom or an alkyl group with 1 to 3 carbon atoms, a monomer represented by the following general formula (II):

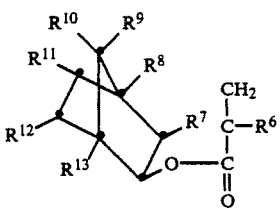

where $R^6$-$R^{13}$ each represents a hydrogen atom or a methyl group, alkyl methacrylate, acrylonitrile and styrene and, added thereto, graft chains having structural units derived from at least one monomer selected from the group consisting of monomers represented by the following general formulae (x) and (y):

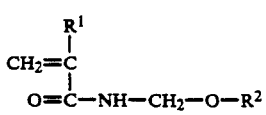

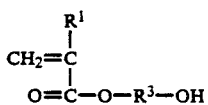

where $R^1$ is a hydrogen atom or an alkyl or hydroxyalkyl group having 1 to 3 carbon atoms, $R^2$ is a hydrogen atom or an alkyl or acryl group having 1 to 4 carbon atoms which may have hydroxy groups, $R^3$ is an alkyl group having 2 to 6 carbon atoms, a halogen-substituted alkyl group having 2 to 6 carbon atoms, an alkylether group represented by the formula:

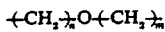

where $2 \leq m+n \leq 6$, $n \neq 0$, $m \neq 0$, or a phenylalkyl group represented by the formula:

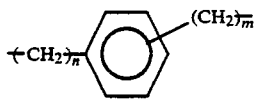

where $2 \leq m+n \leq 4$, or the case where $n=0$ or $m=0$ is contained);

(ii) a linear polymer having a number average molecular weight of 50,000 or more and a weight average molecular weight of 350,000 or less and having a glass transition temperature of 60° C. or higher, which comprises structural units derived from at least one monomer selected from the group consisting of methyl methacrylate, ethyl methacrylate, isobutyl methacrylate, t-butyl methacrylate, benzyl methacrylate, acrylonitrile, isobornyl methacrylate, isobornyl acrylate, tricyclodecane methacrylate, tricyclodecaneoxyethyl methacrylate, styrene, dimethylaminoethyl methacrylate and cyclohexyl methacrylate and structural units derived from at least one monomer selected from the group consisting of the monomers represented by the formula (x) and the formula (y);

(iii) a monomer having ethylenically unsaturated bond, and (iv) a photopolymerization initiator capable of generating free radicals by irradiation of an active energy ray.

DETAILED DESCRIPTION OF THE INVENTION

Each of the ingredients (i)-(iv) for constituting the composition of this invention is to be described more specifically.

In this invention, the trunk chain of the graft-copolymerized polymer (i) mainly comprises the structural unit derived from at least one monomer selected from the group consisting of a monomer containing, in the molecule, a (meth)acryloyl group and a dicyclopentenyl derivative group represented by the general formula (I):

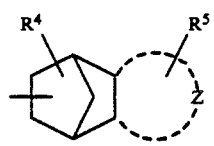

where Z represents a 5-membered ring shown by

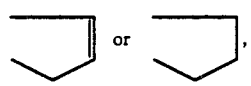

$R^4$ and $R^5$ each represents a hydrogen atom or an alkyl group with 1 to 3 carbon atoms, a monomer represented by the following general formula II:

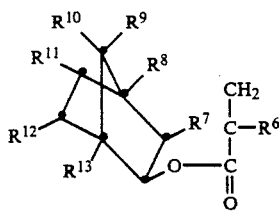

where $R^6$-$R^{13}$ each represents a hydrogen atom or a methyl group, alkyl methacrylate, acrylonitrile and styrene.

The (meth)acryloyl group includes acryloyl group and methacryloyl group.

Particularly, the dicyclopentenyl (meth)acrylate derivative has the feature that the glass transition point is high and hygroscopic property is low and it can provide the composition with higher heat resistance and durability.

As examples of the derivative, there can be mentioned compounds of the following structures:

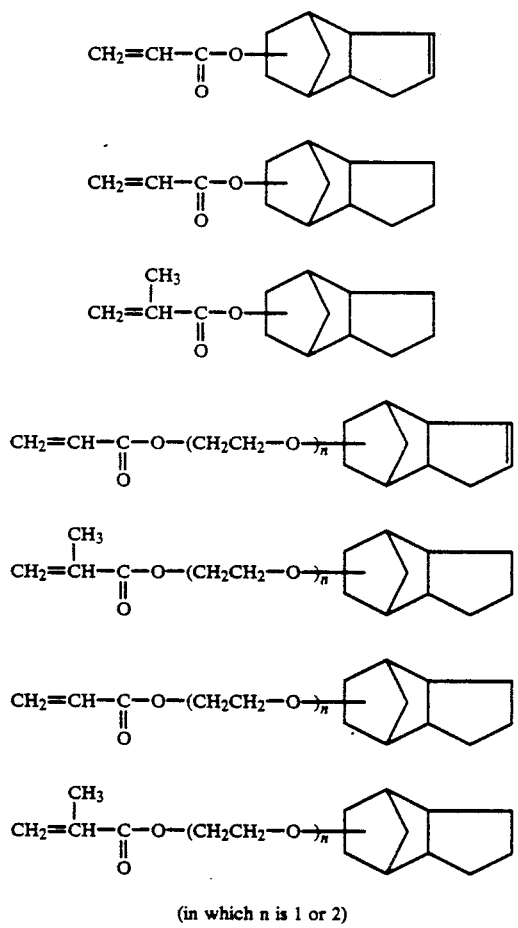

(in which n is 1 or 2)

In the case of using the dicyclopentenyl (meth)acrylate derivative, the blending ratio within a range from 1 to 30% by weight is particularly preferred.

The compound shown by the general formula (II) described above also has a feature that the glass transition points is high and the hygroscopic property is low, and it can provide the composition with higher heat resistance and durability like that the compound shown by the general formula (I) described above.

In the case of using the compound shown by the general formula (II), the blending ratio within a range from 1 to 30% by weight is particularly preferred as well.

A hydrophobic monomer can be also used as the ingredient for the copolymerization within a range of less than about 25 mol %.

The above graft copolymerized polymer (i) can be prepared according to the known methods, specifically by various methods as disclosed in "Base and Application of Polymer Alloy" p. 10-35 (edited by Polymer Society of Japan, published by Tokyo Kagaku Dojin K.K., 1981). Examples of these methods include (1) the chain transfer method, (2) the method by use of radiation, (3) the oxidation polymerization method, (4) the ion graft polymerization method and (5) macromonomer method.

In accordance with any of these methods, the above graft copolymerized polymer (i) to be used in the composition of this invention can be properly prepared using the exemplified monomers under proper polymerization conditions, which makes it possible to obtain a desired graft copolymerized polymer having a number average molecular weight of 5,000 or more and a weight average molecular weight of 50,000 or less.

Among the above methods, the methods of (4) and (5) are preferred since the lengths of the graft chains may be easily uniformed, with the method (5) being most preferred.

The foregoing linear polymer (ii) may be properly prepared in accordance with the conventional polymerization method using the at least one monomer described above as the main component and also using at least one of the monomers represented by the geneal formula (x) or (y), under properly selected polymerization conditions which permits the production of a linear polymer having a number average molecular weight of 50,000 or more and a weight average molecular weight of 350,000 or more and having a glass transition temperature of 60° C. or higher.

In this case, as for the monomer represented by the foregoing general formula (x) or the general formula (y), it is preferred to add the monomer in an amount of 5 to 30 mol % for the following reasons. That is, when more than 30 mol % of the monomer is incorporated into a linear polymer, there are disadvantages that the polar group content in a cured paint film will be undesirably increased and, because of this, any improvement cannot be attained in its adhesiveness with a substrate, and in addition to this, the resulting cured film will be poor in the water proofness. On the other hand, when it is less than 5 mol %, not only the adhesiveness with substrate but also the effects of a paint as the binder will be insufficient.

The monomer (iii) having an ethylenically unsaturated bonds as one ingredient used for the composition in this invention is the ingredient for providing an active energy ray curability to the composition of this invention and various known monomers having a boiling point higher than 100° C. under the atmospheric pressure and, more preferably, those having two or more ethylenically unsaturated bond and curable under the irradiation of active energy rays can be used.

Specific examples of such a monomer having two or more ethylenically unsaturated bonds are, for example, (a) acrylic acid ester or methacrylic acid ester of a polyfunctional epoxy resin having two or more epoxy groups in one molecule, (b) acrylic acid ester or methacrylic acid ester of alkylene oxide adduct of a polyhydric alcohol, (c) polyester acrylate composed of a dibasic acid and a dihydric alcohol having acrylic acid ester group at the terminal end of the molecular chain of the polyester with molecular weight from 500 to 3,000, (d) reaction product of a polyisocyanate and an acrylic acid monomer having hydroxyl group. The monomers (a)–(d) described above may be urethane-modification products having urethane bonds in the molecule.

As the monomer belonging to (a), there can be mentioned acrylic acid or methacrylic acid esters of epoxy resins typically represented by bisphenol-A, novolak or cycloaliphatic type, or bisphenol-S, bisphenol-F, tetrahydroxyphenyl methane tetraglycidyl ether, resorcinol diglycidyl ether, glycerine triglycidyl ether, pentaerythritol triglycidyl ether, isocyanuric acid triglycidyl ether and an epoxy urethane represented by the following general formulae (III):

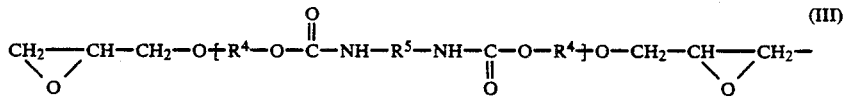

in which R$^4$ represents an alkyl group or oxyalkyl group and R$^5$ represents

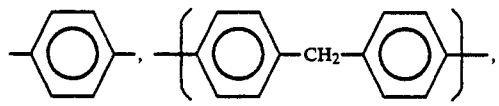

or alkyl group.

As the monomer belonging to (b), there can be mentioned ethylene glycol (dimeth)acrylate, diethylene glycol (meth) acrylate, polyethylene glycol (meth)acrylate, 1,6-hexanediol (meth)acrylate, polyethylene di(meth)acrylate, pentaerythritol tri(meth)acrylate, etc. and those known under the trade names of KAYARAD HX-220, HX-620, D-310, D-320, D-330, DPHA, R-604, DPCA-20, DPCA-30, DPCA-60, DPCA-120 (manufactured by Nippon Kayaku K.K.) and trade names NK ester BPE-200, BPE-500, BPE-1300 and A-BPE-4 (manufactured by Shin Nakamura Kagaku K.K.).

As the monomer belonging to (c), there can be mentioned those known under the trade names of ARONIX M-6100, M-6200, M-6250, M-6300, M-6400, M-7100, M-8030, M-8060, M-8100 (manufactured by Toa Gosei Kagaku K.K.). Those belonging to (c) and containing urethane bonds in the polyester can include those known under the trade names of ARONIX M-1100, ARONIX M-1200 (manufactured by Toa Gosei Kagaku K.K.)

As the monomer belonging to (d) there can be mentioned reaction products of polyisocyanate such as tolylene diisocyanate, isophorone diisocyanate, hexamethylene diisocyanate, lysin diisocyanate and diphenylmethane diisocyanate with an acrylic monomer containing hydroxyl group, and those reaction product obtained by adding (meth)acrylic acid ester containing hydroxyl group to polyisocyanate compound known under the trade names of Sumidule M (buret derivative of hexamethylene diisocyanate), Sumidule L (trimethylol propane modification product of tolylene diisocyanate) (manufactured by Sumitomo Bayer Urethane K.K.) can be used. The acrylic monomer containing hydroxyl group mentioned herein is typically represented by (meth)acrylic acid ester, and hydroxyethyl acrylate, hydroxyethyl methacrylate and hydroxypropyl acrylate are preferred. In addition, other acrylic monomers containing hydroxyl group used for the branch of the graft copolymerized polymer mentioned above, particularly, the compound represented by the general formula (x) can also be used.

In addition to the monomer containing two or more ethylenically unsaturated bonds as described above, the monomer, for example, mentioned below having only one ethylenically unsaturated bond can be used together. As the example of such a monomer having one ethylenically unsaturated bond, there can be mentioned, for example, carboxyl-containing unsaturated monomer such as acrylic acid and methacrylic acid; glycidyl-containing unsaturated monomer such as glycidyl acrylate and glycidyl methacrylte; C$_2$–C$_8$ hydroxyalkyl ester of acrylic acid or methacrylic acid such as hydroxyethyl acrylate, hydroxyethyl methacrylate, hydroxypropyl acrylate and hydroxypropyl methacrylate; monoester of acrylic acid or methacrylic acid with polyethylene glycol or polypropylene glycol such as polyethylene glycol monoacrylate, polyethylene glycol monomethacryalte, polypropylene glycol monoacrylate and polypropylene glycol monomethacrylate; C$_1$–C$_{12}$ alkyl or cycloalckyl ester of acrylic acid or methacrylic acid such as methyl acrylate, ethyl acrylate, propyl acrylate, isopropyl acrylate, butyl acrylate, hexyl acrylate, octyl acrylate, lauryl acrylate, cyclohexyl acrylate, methyl methacryalte, ethyl methacrylate, propyl methacryalte, isopropyl methacryalte, butyl methacrylate, hexyl methacrylate, octyl methacrylate, lauryl methacrylate and cyclohexyl methacrylate; as well as other monomers, for example, acrylic acid or methacrylic acid adduct of vinyl acetate, vinyl chloride, vinyl isobutyl ether, acrylonitrile, acrylamide, methacrylamide and alkyl glycidyl ether, vinylpyrrolidone, dicyclopentenyloxyethyl (meth)acrylate, ϵ-caploractone-modified hydroxyl (meth)acrylate, tetrahydrofurfulyl acrylate and phenoxyethyl acrylate.

By using any one of the monomers having ethylenically unsaturated bond as described above, highly sensitive and sufficient curability to the active energy ray can be provided to the resin composition of this invention.

The resin composition curable with active energy ray of this invention is curable under the irradiation of active energy ray described later and it is preferred to add a photopolymerization initiator in the resin composition.

As the photopolymerization initiator (iv), known substances activated by the active energy ray to generate free organic radicals thereby starting the radical polymerization can be used with no particular restriction.

Specific examples of such photopolymerization initiator that can be used preferably herein are, for example, benzyl; benzoin alkyl ether such as benzoin isobutyl ether, benzoin isopropyl ether, benzoin-n-butyl ether, benzoin ethyl ether and benzoin methyl ether; benzophenones such as benzophenone, 4,4'-bis(N,N-diethylamino)benzophenone and benzophenone methyl ether; anthraquinones such as 2-ethyl anthraquinone and 2-tert-butyl anthraquionone, xanthones such as 2,4-dimethyl thioxanthone and 2,4-diisopropyl thioxanthone; acetophenones such as 2,2-dimethoxy-phenyl acetophenone, α, α-dichloro-4-phenoxy acetophenone, p-tert-butyltrichloro acetophenone, p-tert-butyldichloro acetophenone, 2,2-diethoxy acetophenone and p-dimethylamino acetophenone; or hydroxy cyclohexyl phenyl ketone (Irugacure 184, manufactured by Ciba Geigy Co.); 1-(4-isopropylphenyl)-2-hydroxy-2-methyl-propen-1-one (Darocure 1116, manufactured by Merck Co.); and 2-hydroxy-2-methyl-1-phenyl-propan-1-one (Carocure 1173, manufactured by Merck Co.). In addition to the radical polymerization initiator, an amino compound may be added as a photopolymerization promotor.

As the amino compound use for the photopolymerization promotor, there can be mentioned, for example, ethanolamine, ethyl-4-dimethylamino benzoate, 2-(dimethylamino)ethyl benzoate, p-dimethylamino benzoic acid n-amylester, p-dimethylamino benzoic acid isoamyl ester.

Explanation is to be made for the composition ratio (by weight) of the graft copolymerized polymer (i), linear polymer (ii), ethylenically unsaturated monomer (iii) and photopolymerization initiator (iv). The weight ratio of the graft copolymerized polymer (i) to the linear polymer (ii) is desirably within a range; (i):(ii)=80:-20–50:50. Within this range, preferably adhesiveness due to the graft copolymerized polymer and satisfactory patterning property due to the linear polymer can be obtained. The weight ratio of the total amount (i)+-(ii) of the polymeric material to the ethylenically unsaturated monomer (iii) is desirably within a range; ((i)+-(ii))::(iii)=100:50–100: 200. For the total amount of the resin (i)+(ii)+(iii) the photopolymerization initiator (iv) is desirably used within a range; ((i)+(ii)+(iii)) : (iv)=100:1 — 100:10.

The total amount (A) of the photopolymerization initiator and/or amino compound as the photopolymerization promotor if used to the photopolymerization initiator (iv) is preferably within a range; (iv) : (A)=1:0.05–1:1.

Furthermore, to the resin composition curable with active energy according to this invention, there can be added, as required, a condensating crosslinking catalyst, thermopolymerization inhibitor, colorant such as dye or pigment, heat stabilizer such as hydroquinone or paramethoxyphenyl, adhesion promotor, plasticizer or humidity resistant pigment such as silica or talc, levelling agent for providing coatability, etc.

As the condensating crosslinking catalyst, there can be mentioned sulfonic acid typically represented by paratoluene sulfonic acid, carboxylic acid such as formic acid, etc. As the colorant, an oil-soluble dye or pigment can be added within such a range as not substantially hindering the transmission of the active energy ray. As for the filler, a humidity-resistant pigment, fine plastic particles, etc. employed generally in the paints are used in order to increase the hardness, coloration, improve the adhesiveness and the mechanical strength of the coated films. As the adhesion promotor, silane coupling agent as the inorganic surface modifier or surface active agent can be mentioned.

In the case of using the resin composition curable with active energy ray according to this invention in a liquid form or coating the composition on a plastic film as a film substrate upon preparing a dry film, the solvent used therefor can include, for example, those hydrophilic solvents such as alcohols, glycol ethers and glycol esters. It is of course possible to use those comprising such a hydrophilic solvent as the main ingredient and properly admixed therewith as required, ketone such as methyl ethyl ketone and methyl isobutyl ketone, ester such as ethyl acetate or isobutyl acetate, aromatic hydrocarbon such as toluene or xylene and halogen substituted derivatives thereof, chlorine-containing aliphatic solvent such as methylene chloride and 1,1,1-trichloroethane. These solvents may be used as the liquid developer for the resin composition according to this invention.

The active energy ray-curing resin composition according to this invention as explained above may be applied onto a substrate in accordance with any of the conventional methods. Specific examples of such method will be below illustrated:

(1) In the case of forming a cured film coat on a substrate, the active energy ray-curing resin composition is liquid state is applied onto the substrate to form a liquid coat thereon which is followed by evaporation to dryness, then the resultant dried coat is cured by irradiating it with an active energy.

(2) In the case of forming a protective cured layer in the form of a desired pattern on a substrate, the active energy ray-curing resin composition in liquid state is applied onto the substrate to form a liquid coat thereon which is followed by evaporation to dryness, the resultant dry layer is scanned with laser beam in a desired pattern, and the unexposed portion is etched off with a proper solvent such as 1,1,1-trichloroethane to thereby form a protective cured layer in the form of a desired pattern on the substrate.

(3) In the case of forming a protective cured layer coat in the form of a desired pattern on a substrate, the active energy ray-curing resin composition in liquid state is applied onto the substrate to form a liquid coat thereon which is followed by evaporation to dryness, a photomask having a pattern with a desired shape which does not transmit any active energy ray is superposed on the resultant dry film layer, then exposure with an active energy ray is effected from above the photomask, and the unexposed portion is removed by a proper solvent such as 1,1,1-trichloroethane to thereby form a protective cured layer in the form of a desired pattern on the substrate.

(4) In the case of forming a photosensitive dry film and laminating said dry film on a substrate, the active energy ray-curing resin composition in liquid state is applied onto a polyethylene terephthalate film to form a liquid coat thereon which is followed by evaporation dryness, whereby obtaining a photosensitive dry film on the said polyethylene terephthalate film, the resultant is laminate onto a substrate in accordance with the conventional lamination method to obtain a laminate, and the photosensitive dry film as laminated on the substrate is cured by irradiating it with an active energy ray in the same way as in the above method (1).

If the resulting cured photosensitive film is desired to have been shaped in a desired pattern, the above dry film as laminated on the substrate is treated in the same way as the above method (2) or (3).

In the case where the active energy ray-curing resin composition is one that contains the monomer represented by the foregoing formula (1), the cured film as obtained in any of the above methods (1) to (4) is desired to be further subjected to heat-treatment at a temperature of 80° C. to 200° C. to thereby condensedly cure it.

The active energy ray to be used for curing the active energy ray-curing resin composition of this invention or for the pattern exposure may include ultraviolet rays (UV-rays) or electron beams which have widely been practically applied. As the UV-ray light source, there may be employed high pressure mercury lamps, ultra-high pressure mercury lamps, metal halide lamps, etc., enriched in light with wavelength of 250 nm to 450 nm, preferably those which can give a light intensity of about 1 mW/cm$^2$ to 100 mW/cm$^2$ at the wavelength in the vicinity of 365 nm at a distance between the lamp and the material to be irradiated which is practically permissible. The electron beam irradiation device is not particularly limited, but a device having a dose within the range of 0.5 to 20M Rad is practically suitable.

The active resin composition curable with active energy ray according to this invention can be used, for example, as protection coating for glass, as adhesives, surface improvement such as transparent or opaque coloration, provision of water proofness, water repellency and contamination-resistance to insulation layer of liquid crystal display device or glass plate.

The resin composition is also useful for the etching of glass, masking material of metallizing such as electroless plating and soldering mask for printed wiring substrate, utilizing the excellent chemical resistance thereof.

PREFERRED EMBODIMENT OF THE INVENTION

The advantages of this invention are now described in more detail by reference to the following Examples, which are provided merely for illustrative purposes only, and are not intended to limit the scope of this invention.

EXAMPLE 1

1. Provision of each of the components (i) to (iv) for the preparation of a active energy ray-curing resin composition of this invention Preparation of a graft copolymerized polymer (i)

Radical chain transfer polymerization of 50 parts by weight of 2-hydroxyethylmethacrylate and 50 parts by weight of N-methylolacrylamide was carried out using thioglycollic acid as the chain transferring agent and azobisisobutyronitrile as the polymerization initiator to obtain an oligomer having a carboxyl group at the terminal end of the molecular chain.

This oligomer was reacted with glycidylmethacrylate to obtain a macromonomer having a methacryloyl group at one terminal end of the molecular chain. The result of the measurement by the known GPC method gave a value of about 3,000 for the number average molecular weight of the resultant macromonomer.

Solution polymerization of 20 parts by weight of the said macromonomer and 80 parts by weight of methylmethacrylate was carried out in methyl cellosolve solvent to thereby obtain a graft copolymerized polymer having a weight average molecular weight of about 40,000 and a number average molecular weight of about 10,000.

A linear polymer (ii)

There was provided a linear acrylic copolymer obtained by polymerizing methylmethacrylate, tricyclodecaneoxyethylmethacrylate and N-methylolacrylamide in the molar ratio of 80:10:10. This linear acrylic copolymer is one that has a number average molecular weight of about 100,000 and a weight average molecular weight of about 270,000.

A monomer having an ethylenically unsaturated bond (iii)

There were provided the following two kinds of monoers (iii)-(1) and (iii)-(2):
(iii)-(1): trimethylolpropanetriacrylate
(iii)-(2): epoxy ester 3002M A photopolymerization initiator (iv)

There were provided the following two kinds of photopolymerization initiators (iv)-(1) and (iv)-(2):
(iv)-(1): benzophenone
(iv)-(2): Michler's ketone 2. Preparation of an active energy ray-curing resin composition of this invention.

The above components (i) to (iv)-(2) were well mixed by the weight ratios as below shown in accordance with the conventional mixing technique to thereby obtain the active energy ray-curing resin composition, in which there were used the additives as below shown.

| Component | Parts by weight |
| --- | --- |
| (i) | 50 |
| (ii) | 50 |
| (iii)-(1) | 20 |
| (iii)-(2) | 80 |
| (iv)-(1) | 10 |
| (iv)-(2) | 3 |
| Methylene Blue | 0.3 |
| ethyl cellosolve acetate | 200 |
| methylethyl ketone | 100 |

3. Preparation of a resin cured film

The thus obtained active energy ray-curing resin composition in liquid state was applied onto the cleaned surface of a glass plate to form a liquid coat of about 80 μm in thickness, followed by air-dryness at 100° C. for 15 minutes to obtain a dry film of about 40 μm on the glass plate.

The glass plate having said dry film thereon was exposed to active energy rays with maximum irradiation energy of 100 mW/cm$^2$ from the conventional ultra-high pressure mercury lamp for 10 seconds. Thereafter, it was heat-treated at 150° C. for 30 minutes.

The resultant was subjected to reflux treatment in 1% caustic soda aqueous solution for 10 hours.

The thus obtained laminate was tested and as a result, it was found that the exposed (cured) resin film is firmly adhered to the glass plate, and there were not observed any chloroisis or bulging phenomena on the resultant film even after storage for a long period of time.

EXAMPLE 2

1. Provision of each of the components (i) to (iv) for the preparation of an active energy ray-curing resin composition of this invention Preparation of a graft copolymerized polymer (i)

The procedures for the preparation of the macromonomer in Example 1 were repeated, except that there were used 50 parts by weight of 2-hydroxyethylmethacrylate and 50 parts by weight of butoxymethylacrylamide, to thereby obtain a macromonomer having a methacryloyl group at one terminal end of the molecular chain.

The result of the measurement by the known GPC method gave a value of about 4,000 for the number average molecular weight of the resultant macromonomer.

Solution polymerization of 30 parts by weight of the said macromonomer and 70 parts by weight of methylmethacrylate was carried out in a solvent containing methyl cellosolve and methylethy ketone by the weight ratio of 60:40 to thereby obtain a thermosetting graft copolymerized polymer having a number average molecular weight of about 5,000 and a weight average molecular weight of about 40,000.

A linear polymer (ii)

There was provided a linear acrylic copolymer obtained by polymerizing methylmethacrylate, isobornylmethacrylate and butoxymethylacrylamide in the molar ratio of 70:20:10. This linear acrylic copolymer is one that has a number average molecular weight of about 150,000 and a weight average molecular weight of about 320,000.

A monomer having an ethylenically unsaturated bond (iii)

There were provided the following two kinds of monomers (iii)-(1) and (iii)-(2):
(iii)-(1): 2-hydroxyethylacrylate adduct to diphenylmethane diisocyanate
(iii)-(2): DPCA-60 (produced by Nihonkayaku K. K.)

A photopolymerization initiator (iv)

There were provided the following two photopolymerization initiators (iv)-(1) and (iv)-(2):
(iv)-(1): benzophenone
(iv)-(2): Michler's ketone 2. Preparation of an active energy ray-curing resin composition of this invention.

The above components (i) to (iv)-(2) were well mixed by the weight ratios as below shown in accordance with the conventional mixing technique to thereby obtain the active energy ray-curing resin composition, in which there were used the additives as below shown.

| Component | Parts by weight |
| --- | --- |
| (i) | 80 |
| (ii) | 20 |
| (iii)-(1) | 120 |
| (iii)-(2) | 40 |
| (iv)-(1) | 12 |
| (iv)-(2) | 3 |
| Methylene Blue | 0.3 |
| methyl cellosolve | 250 |
| methylethyl ketone | 80 |

3. Preparation of a protective resin cured film on a printed board

On a printed board comprising conductor circuit composed of 60 μm thick cupper foil formed on a glass cross epoxy resin substrate, there was formed a liquid coat of the thickness to be 50 μm when dried by applying the resin composition in liquid state obtained in the above step 2 by way of the conventional roll coater.

The liquid coat was then air-dried at 100° C. for 3 minutes.

After cooling, a solder mask pattern was superposed on the dry film and subjected to pattern exposure for 15 seconds using the conventional ultra-high pressure mercury lamp of generating collimated UV ray, the luminous flux density of the UV ray from which is to be 7 mW/cm$^2$ near 365 nm and the collimation amplitude is to be 3°. After completion of the exposure, the resultant was engaged in spray-development with 1,1,1-trichloroethane at 20° C. for 50 seconds. The development was stably proceeded and as a result, there was formed a clear pattern. After completion of the development, the cured dry film on the printed board was air-dried and further irradiated with UV ray from the above mercury lamp for 5 minutes, followed by heat-treatment at 150° C. for 15 minutes to thereby complete the formation of a patterned resin cured protective film on the printed board.

As a result of examining the resultant protective film, it was found that the film is excellent in the resistance against not only acids but also alkalis and also in the resistance against other chemicals.

EXAMPLE 3

The active energy ray-curing resin composition obtained in Example 2 was applied onto a lamination plate, which had been appended with a copper foil polished with a polishing roll comprising No. 1000 Scotch Bright (produced by Sumitomo 3M Co., Ltd.), to form a liquid coat using the conventional roll coater, followed by air-dryness to obtain a dry film of about 50 μm in thickness in the same way as in Example 2.

Subsequently, on the cooled dry film laminated on the copper foil laminate, a mask film having an equidistance stripe-like pattern with the stripe width for the not lightpermeable portion of 100 μm and the interval for the light permeable portion of 50 μm was superposed, and the dry film was subjected to exposure and development in the same manners as in Example 2.

In this way, there were prepared four different group samples (Samples Groups I to IV) with four different exposure energies i.e. 50 mJ/cm$^2$, 70 mJ/cm$^2$, 90 mJ/cm$^2$ and 110 mJ/cm$^2$.

In each of the Sample Groups I to IV, there were prepared three different samples with different developing periods of time i.e. 30 seconds, 60 seconds and 90 seconds.

For the comparison purpose, the procedures of Example 2 for the preparation of the active energy ray-curing resin composition were repeated, except that the amount of the graft copolymerized polymer (i) was changed to 100 parts by weight and there was not used the linear polymer (ii), to thereby obtain a comparative resin composition.

And, using this comparative resin composition, there were prepared Comparative Sample Group I to IV samples by repeating the above procedures.

The samples thus obtained were evaluated by the conventional evaluation method with respect to pattern resolution, residual undeveloped portion and pattern swelling.

The evaluation results were as shown in the following Table.

TABLE

|  |  | 30 seconds | 60 seconds | 90 seconds |
|---|---|---|---|---|
| 50 mJ/cm$^2$ | Sample Group I | o | o | o |
|  | Comparative Sample Group I | o | x | x |
| 70 mJ/cm$^2$ | Sample Group II | o | o | o |
|  | Comparative Sample Group II | x | o | x |
| 90 mJ/cm$^2$ | Sample Group III | o | o | o |
|  | Comparative Sample Group III | x | x | o |
| 110 mJ/cm$^2$ | Sample Group IV | o | o | o |
|  | Comparative Sample Group IV | x | o | o |

Note:
o: pattern is well resolved, and neither residual undeveloped portion nor pattern swelling are observed.
x: residual undeveloped portion or/and pattern swelling is observed.

As Table illustrates, it is understood that the active energy ray-curing resin composition of this invention is always stable without depending upon exposure conditions and developing conditions.

EXAMPLE 4

The procedures of Example 3 were repeated to examine the pattern forming ability and the adhesiveness of the active energy ray-curing composition according to this invention, except that as the graft copolymerized polymer, there was used a graft copolymerized polymer which was prepared in the following way.

Radical chain transfer polymerization of 80 parts by weight of 2-hydroxyethylmethacrylate and 20 parts by weight of t-butylacrylate was carried out using thioglycollic acid as the chain transferring agent and azobisisobutyronitrile as the polymerization initiator to obtain an oligomer having a carboxyl group at the terminal end of the molecular chain.

This oligomer was reacted with glycidylmethacrylate to obtain a macromonomer having a methacryloyl group at one terminal end of the molecular chain. The result of the measurement by the known GPC method gave a value of about 2,000 for the number average molecular weight of the resultant macromonomer. Then, solution polymerization of 30 parts by weight of the said macromonomer, 50 parts by weight of methylmethacrylate and 20 parts by weight of dicyclopentenylmethacrylate was carried out in methyl cellosolve solvent to thereby obtain a thermosetting graft copolymerized polymer having a weight average molecular weight of about 50,000 and a number average molecular weight of about 10,000.

As a result, it was found that the active energy ray-curing resin composition of this invention is always stable without depending upon exposure conditions and developing conditions. It was also found that the resin cured film composed of the active energy ray-curing composition of this invention is excellent in the adhesiveness with a substrate.

EXAMPLE 5

The procedures of Example 2 were repeated to examine the resistant properties against chemicals of the active energy ray-curing composition according to this invention, except that as the graft copolymerized polymer, there was used a graft copolymerized polymer which was prepared in the following way.

Radical chain transfer polymerization of 80 parts by weight of 2-hydroxyethylmethacrylate and 20 parts by weight of t-butylacrylate was carried out using thioglycollic acid as the chain transferring agent and azobisisobutyronitrile as the polymerization initiator to obtain an oligomer having a carboxyl group at the terminal end of the molecular chain.

This oligomer was reacted with glycidylmethacrylate to obtain a macromonomer having a methacryloyl group at one terminal end of the molecular chain. The result of the measurement by the known GPC method gave a value of about 2,000 for the number average molecular weight of the resultant macromonomer. Then, solution polymerization of 30 parts by weight of the said macromonomer, 50 parts by weight of methylmethacrylate and 20 parts by weight of was carried out in methyl cellosolve solvent to thereby obtain a graft copolymerized polymer having a weight average molecular weight of about 40,000 and a number average molecular weight of about 15,000.

As a result of examining the resultant protective film, it was found that the film is excellent in the resistance against not only acids but also alkalis and also in the resistance against other chemicals.

As has been described above, since the resin composition curable with active energy ray according to this invention comprises the graft copolymerized polymer (i) as the constituent ingredient, it shows a sufficient adhesiveness to various kind of supports without using additives and since it comprises the linear high polymer (ii) as the constituent ingredient, it is excellent in the developing property upon pattern formation. Furthermore, it also shows sufficient chemical resistance, durability, etc. to be used for various application uses.

Furthermore, since the composition according to this invention uses the graft copolymerized polymer and the linear polymer together as the polymeric material for the constituent ingredients, it can form a solvent-resistant coating film to the liquid developer with less irradiation of active energy ray as compared with the case of using only the graft copolymerized polymer as the polymeric material and, as a result, it can provide high sensitivity, increased resolution power and improve the property of patterning process such that the pattern can be formed irrespective of the kinds and the states of the substrate to thereby extend the rnge of conditions for the operations. Accordingly, the application use can be widened as compared with the conventional compositions.

What is claimed is:

1. A resin composition curable with active energy ray, comprising:
    (i) a graft copolymerized polymer having a number average molecular weight of 5,000 or more and a weight average molecular weight of 50,000 or less, which comprises a trunk chain composed mainly of structural units derived from at least one monomer selected from the group consisting of a monomer containing, in the molecule, a (meth)acryloyl group and a dicyclopentenyl derivative group represented by the general formula (I):

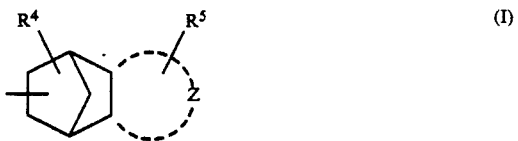

wherein Z represents a 5-membered ring shown by

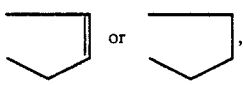

$R^4$ and $R^5$ each represents a hydrogen atom or an alkyl group with 1 to 3 carbon atoms, a monomer represented by the following general formula (II):

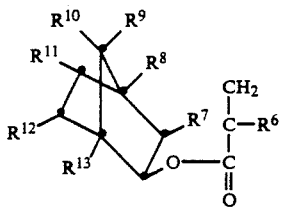 (II)

wherein $R^6$–$R^{13}$ each represents a hydrogen atom or a methyl group, alkyl methacrylates, acrylonitrile and styrene and, added thereto, graft chains having structural units derived from at least one monomer selected from the group consisting of monomers represented by the following general formulae (x) and (y):

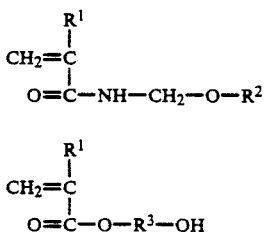

wherein $R^1$ is a hydrogen atom or an alkyl or hydroxyalkyl group having 1 to 3 carbon atoms, $R^2$ is a hydrogen atom or an alkyl or acrylic group having 1 to 4 carbon atoms which may have hydroxy groups, $R^3$ is an alkyl group having 2 to 6 carbon atoms, a halogen-substituted alkyl group having 2 to 6 carbon atoms, an alkylether group represented by the formula:

wherein $2 \leq m+n \leq 6$, $n \neq 0$, $m \neq 0$, or a phenylalkyl group represented by the formula:

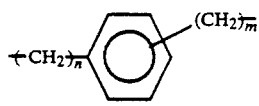

wherein $2 \leq m+n \leq 4$, or the case wherein $n=0$ or $m=0$ is contained);

(ii) a linear polymer having a number average molecular weight of 50,000 or more and a weight average molecular weight of 350,000 or less and having a glass transition temperature of 60° C. or higher, which comprises structural units derived from at least one monomer selected from the group consisting of methyl methacrylate, ethyl methacrylate, isobutyl methacrylate, t-butyl methacrylate, benzyl methacrylate, acrylonitrile, isobornyl methacrylate, isobornyl acrylate, tricyclodecane methacrylate, tricyclodecaneoxyethyl methacrylate, styrene, dimethylaminoethyl methacrylate and cyclohexyl methacrylate, and structural units derived from at least one monomer in amounts from 5 to 30 mole percent selected from the group consisting of said monomers represented by the formula (x) and the the formula (y) described above;

(iii) a monomer having ethylenically unsaturated bond, and (iv) a photopolymerization initiator capable of generating free radicals by irradiation of an active energy ray.

2. A resin composition curable with an active energy ray as defined in claim 1, wherein the weight of the graft copolymerized polymer (i) and the linear polymer (ii) is;

(i):(ii) = 80:20–50:50.

3. A resin composition curable with an active energy ray as defined in claim 1 or 2, wherein the weight ratio of the total weight for the graft copolymerized polymer (i) and the linear polymer (ii) to the monomer (iii) is: ((i)+(ii)):(iii) = 100:50 to 100:200.

4. A resin composition curable with an active energy ray as defined in claim 1, wherein the weight ratio of the total weight for the graft copolymerized polymer (i), the linear polymer (ii) and the monomer (iii) to the weight of the photopolymerization initiator (iv) is; ((i)+(ii)+(iii)):(iv) = 100:1–100:10.

* * * * *